(12) United States Patent
Yeh et al.

(10) Patent No.: US 8,048,733 B2
(45) Date of Patent: Nov. 1, 2011

(54) METHOD FOR FABRICATING A GATE STRUCTURE

(75) Inventors: Matt Yeh, Hsinchu (TW); Yi-Chen Huang, Hsinchu (TW); Fan-Yi Hsu, Toufen Town (TW); Ouyang Hui, Chubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/757,295

(22) Filed: Apr. 9, 2010

(65) Prior Publication Data

US 2011/0086502 A1    Apr. 14, 2011

Related U.S. Application Data

(60) Provisional application No. 61/250,266, filed on Oct. 9, 2009.

(51) Int. Cl.
*H01L 21/8238* (2006.01)

(52) U.S. Cl. ........ 438/199; 438/704; 438/706; 438/715; 438/785; 438/E21.632

(58) Field of Classification Search .................. None
See application file for complete search history.

(56) References Cited

U.S. PATENT DOCUMENTS

| | | | | |
|---|---|---|---|---|
| 6,284,146 B1 * | 9/2001 | Kim et al. | .......... | 216/6 |
| 6,440,808 B1 * | 8/2002 | Boyd et al. | .......... | 438/305 |
| 2008/0265322 A1 * | 10/2008 | Lin et al. | .......... | 257/347 |
| 2010/0124818 A1 * | 5/2010 | Lee et al. | .......... | 438/589 |
| 2010/0255654 A1 * | 10/2010 | Lin et al. | .......... | 438/424 |

\* cited by examiner

*Primary Examiner* — Alonzo Chambliss
(74) *Attorney, Agent, or Firm* — Lowe Hauptman Ham & Berner, LLP

(57) ABSTRACT

An method of fabricating the gate structure comprises: sequentially depositing and patterning a dummy oxide layer and a dummy gate electrode layer on a substrate; surrounding the dummy oxide layer and the dummy gate electrode layer with a nitrogen-containing dielectric layer and an interlayer dielectric layer; removing the dummy gate electrode layer; removing the dummy oxide layer by exposing a surface of the dummy oxide layer to a vapor mixture comprising $NH_3$ and a fluorine-containing compound at a first temperature; heating the substrate to a second temperature to form an opening in the nitrogen-containing dielectric layer; depositing a gate dielectric; and depositing a gate electrode.

21 Claims, 12 Drawing Sheets

METHOD FOR FABRICATING A GATE STRUCTURE

CROSS-REFERENCE TO RELATED APPLICATIONS

The present application claims priority of U.S. Provisional Patent Application Ser. No. 61/250,266, filed on Oct. 9, 2009, which is incorporated herein by reference in its entirety.

TECHNICAL FIELD

The disclosure relates to integrated circuit fabrication, and more particularly to a semiconductor device with a gate structure.

BACKGROUND

As the dimensions of transistors decrease, the thickness of the gate oxide must be reduced to maintain performance with the decreased gate length. However, in order to reduce gate leakage, high dielectric constant (high-k) gate oxide layers are used which allow greater physical thicknesses while maintaining the same effective thickness as would be provided by a typical gate oxide used in future technology nodes.

Additionally, as technology nodes shrink, in some integrated circuit (IC) designs, there has been a desire to replace the typically polysilicon gate electrode with a metal gate electrode to improve device performance with the decreased feature sizes. One process of forming the metal gate electrode is termed "gate last" process in which the final metal gate electrode is fabricated "last" which allows for reduced number of subsequent processes, including high temperature processing, that must be performed after formation of the gate.

FIGS. 1A-C show cross-sectional views of a plurality of conventional gate structures 101 for semiconductor devices 100 at various stages of fabrication in a "gate last" process. FIG. 1A illustrates the plurality of gate structures 101 may be formed by sequentially depositing and patterning a dummy oxide layer 106 and a dummy gate electrode layer (not shown) on the silicon substrate 102 including isolation regions 104; forming lightly doped source/drain (LDD) regions 112 in the substrate 102; surrounding the dummy oxide layer 106 and the dummy gate electrode layer with a nitrogen-containing dielectric layer 110; forming source/drain (S/D) regions 114 in the substrate 102; surrounding the nitrogen-containing dielectric layer 110 with a contact etch stop layer 116 and an interlayer dielectric (ILD) layer 118, such as silicon oxide; removing the dummy gate electrode layer to form an opening 120 in the nitrogen-containing dielectric layer 110.

However, problems arise when subsequently removing the dummy oxide layer 106 to form a larger opening 130 in the nitrogen-containing dielectric layer 110, which typically involve wet and/or dry etching steps. During wet etching step, top portions of the ILD layer 118 are isotropically removed leaving a plurality of recesses 118a in the ILD layer 118 (shown in FIG. 1B). This is due to the use of hydrofluoric (HF) acid in the wet etching steps, and the opening 120 limits entrance of the HF acid into interior surface of the opening 120. Thus, less HF acid reaches bottom of the opening 120, i.e., top of the dummy oxide layer 106, so more of the ILD layer 118 reacts and less removed from the dummy oxide layer 106. In another way, FIG. 1C shows a plurality of recesses 102a in the silicon substrate 102 may be formed due to the use of plasma during dry etching step, which recesses the silicon substrate 102. The plurality of recesses 102a or 118a are problematic in various respects. For example, the plurality of recesses 102a present in the silicon substrate 102 may change dopants distribution in channel regions. Thus, performance characteristics such as threshold voltage and reliability may degrade. For another example, the plurality of recesses 118a present in the ILD layer 118 can become a receptacle of metals during subsequent processing thereby increasing the likelihood of electrical shorting and/or device failure.

Accordingly, what is needed is a method for fabricating a gate structure having almost no recess in the interlayer dielectric layer or the substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1A:
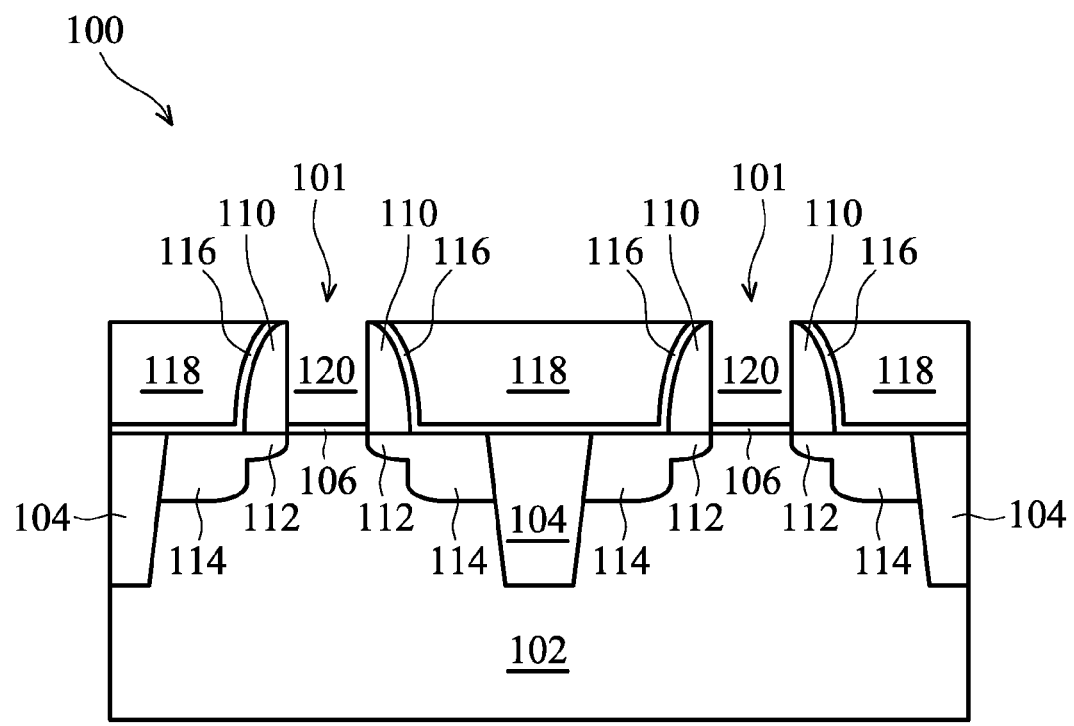
FIGS. 1A-C show cross-sectional views of a plurality of conventional gate structures for semiconductor devices at various stages of fabrication in a "gate last" process.
Figure 1B:
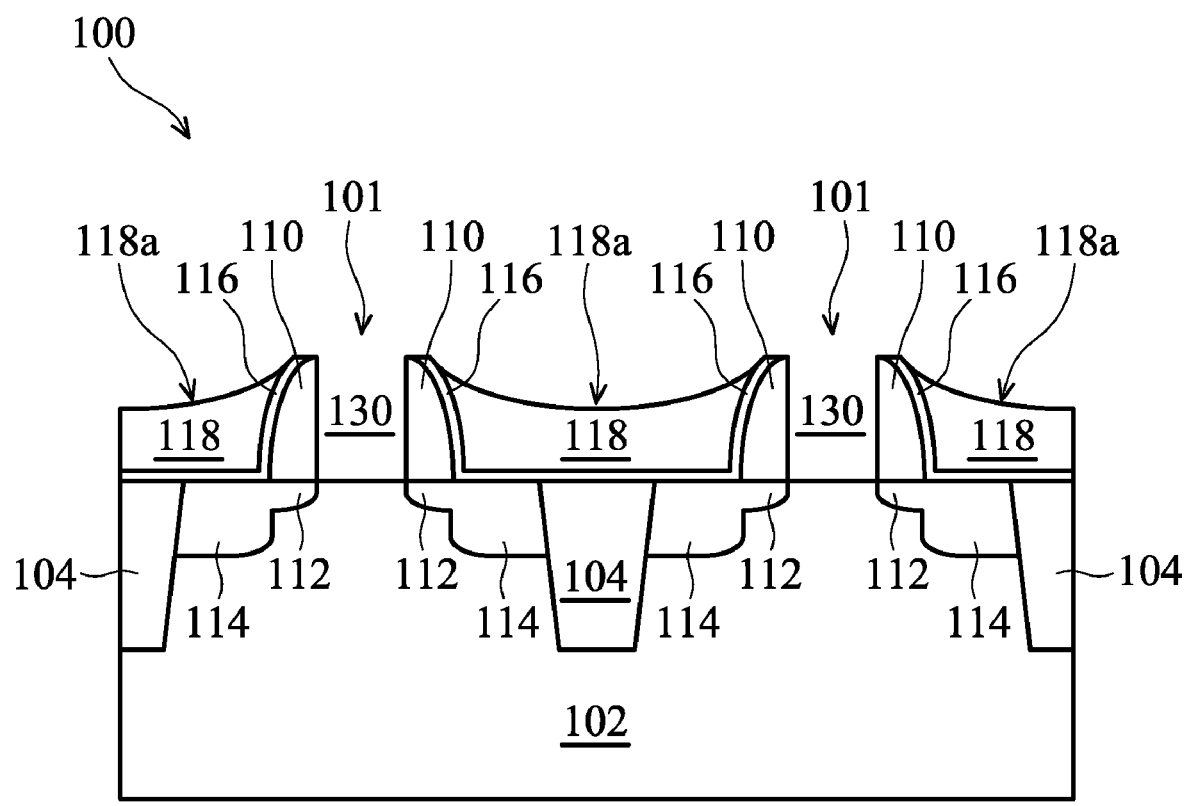
Figure 1C:
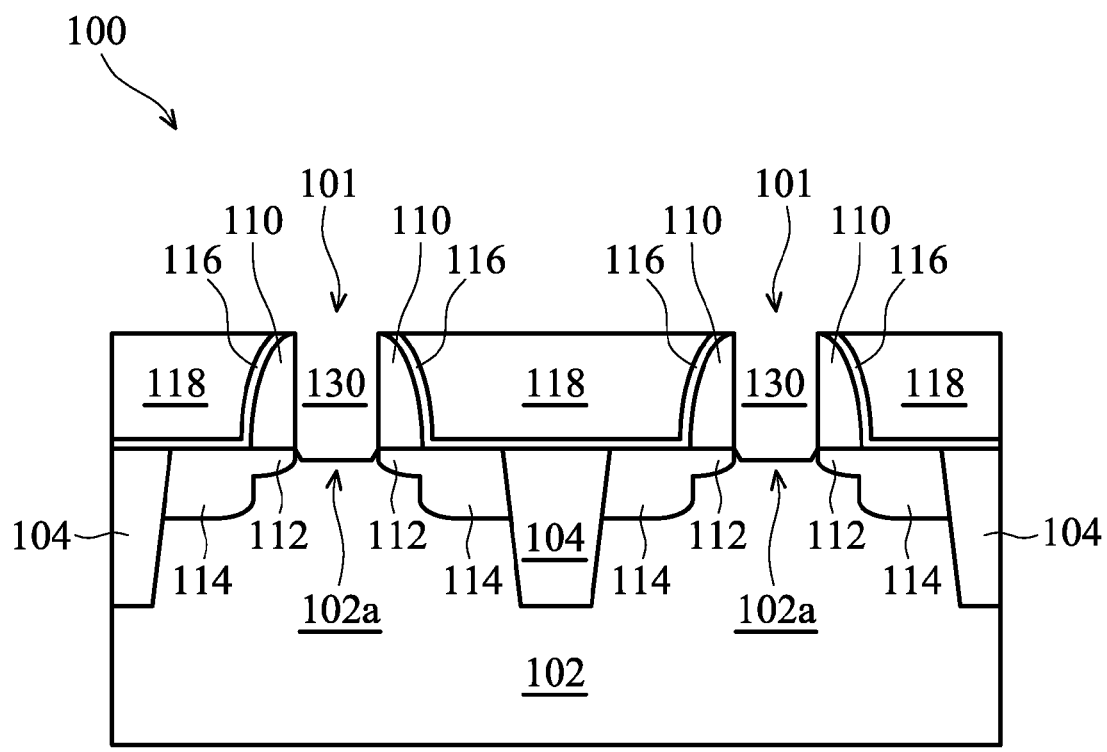

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
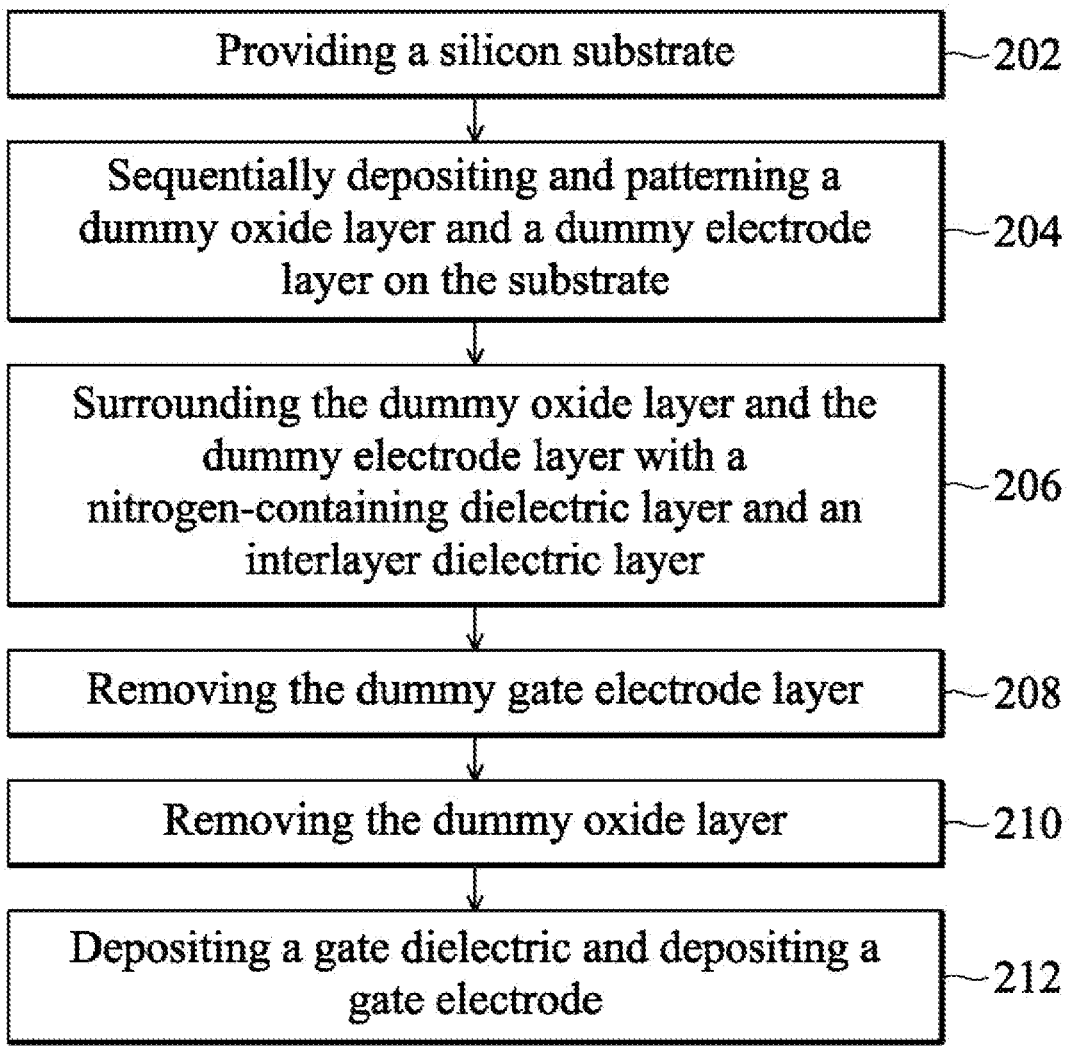
FIG. 2 is a flowchart illustrating a method for fabricating a plurality of gate structures according to various aspects of the present disclosure.

With reference to FIGS. 2 and 3A through 3H, a method 200 and semiconductor devices 300 are collectively described below. FIG. 2 is a flowchart illustrating a method 200 for fabricating a plurality of gate structures 331 (FIG. 3H) according to various aspects of the present disclosure. FIGS. 3A-H show schematic cross-sectional views of a plurality of gate structures 331 at various stages of fabrication according to an embodiment of the method 200 of FIG. 2. It is understood that part of the semiconductor devices 300 may be fabricated with complementary metal-oxide-semiconductor (CMOS) technology processes, and thus some processes are briefly described herein. Also, FIGS. 2 and 3A through 3H are simplified for a better understanding of the present disclosure. For example, although the figures illustrate a gate structure for the semiconductor devices 300, it is understood the IC may include a number of other devices including resistors, capacitors, inductors, fuses, etc.

Figure 3A:
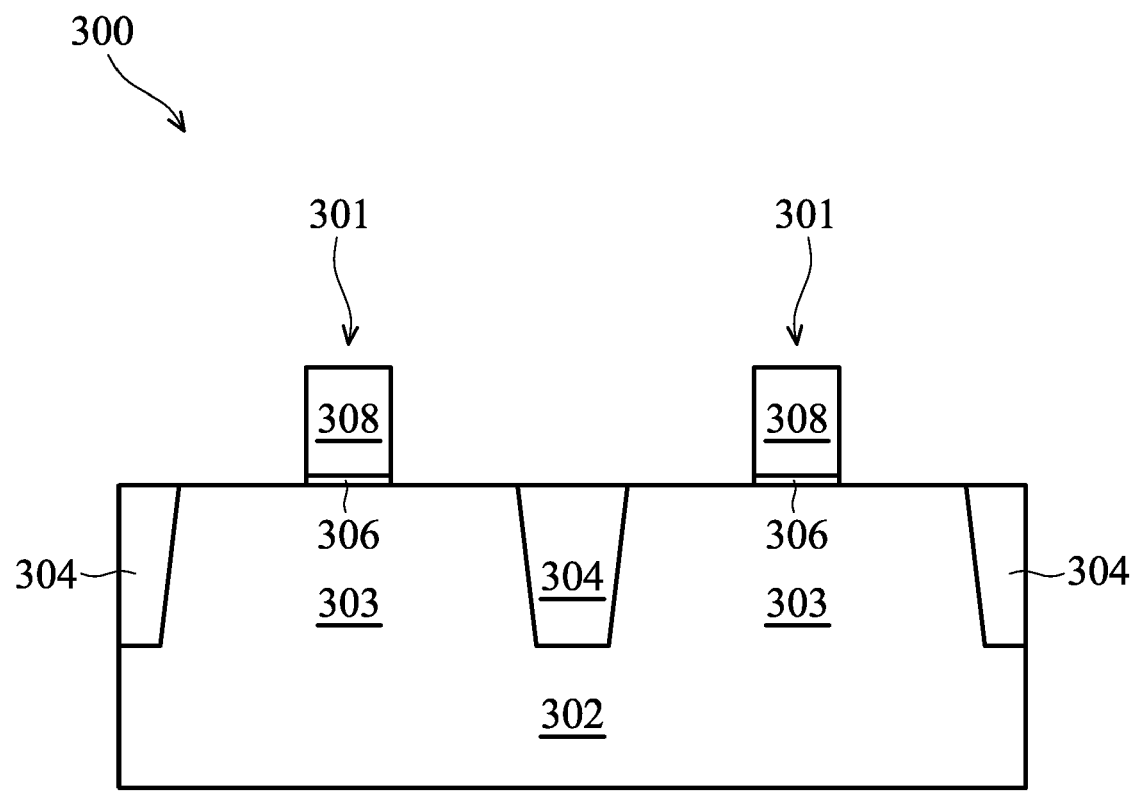
FIGS. 3A-H show schematic cross-sectional views of a plurality of gate structures at various stages of fabrication according to an embodiment of the method of FIG. 2.

Referring to FIGS. 2 and 3A, the method 200 begins at step 202 wherein a substrate 302 including active regions 303 and isolation regions 304 is provided. In one embodiment, the substrate 302 comprises a crystalline silicon substrate (e.g., wafer). In some embodiments, the substrate 302 may include various doping configurations depending on design requirements (e.g., p-type substrate or n-type substrate). Further, in some embodiments, the substrate 302 may include an epitaxial layer (epi layer), may be strained for performance enhancement, and/or may include a silicon-on-insulator (SOI) structure.

The active regions 303 may include various doping configurations depending on design requirements. In some embodiments, the active regions 303 may be doped with p-type or n-type dopants. For example, the active regions 303 may be doped with p-type dopants, such as boron or $BF_2$; n-type dopants, such as phosphorus or arsenic; and/or combinations thereof. The active regions 303 may act as regions configured for a N-type metal-oxide-semiconductor transistor device (referred to as an NMOS) and regions configured for a P-type metal-oxide-semiconductor transistor device (referred to as a PMOS).

The isolation regions 304 may be formed on the substrate 302 to isolate the various active regions 303. The isolation regions 304 may utilize isolation technology, such as local oxidation of silicon (LOCOS) or shallow trench isolation (STI), to define and electrically isolate the various active regions 303. In at least one embodiment, the isolation region 304 includes a STI. In some embodiments, the isolation regions 304 may comprise silicon oxide, silicon nitride, silicon oxynitride, fluoride-doped silicate glass (FSG), a low-K dielectric material, other suitable materials, and/or combinations thereof. The isolation regions 304, and in the present embodiment, the STI, may be formed by any suitable process. As one example, the formation of the STI may include patterning the semiconductor substrate 302 by a conventional photolithography process, etching a trench in the substrate 302 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIGS. 2 and 3A, the method 200 continues with step 204 in which a dummy gate structure 301 is formed by sequentially depositing and patterning a dummy oxide layer 306 and a dummy gate electrode layer 308 on the substrate 302. The dummy gate structure 201 may be formed using any suitable process, including the processes described herein. In one example, the dummy oxide layer 306 and dummy gate electrode layer 308 are sequentially deposited on the substrate 302. In at least one embodiment, the dummy oxide layer 306 is preferably formed of silicon oxide grown by a thermal oxidation process, having a thickness of about 10 to 30 Å. For example, the dummy oxide layer 306 can be grown by the rapid thermal oxidation (RTO) process or in an annealing process comprising oxygen. In some embodiments, the dummy gate electrode layer 308 may comprise a single layer or multilayer structure. In at least one embodiment, the dummy gate electrode layer 308 may comprise poly-silicon. Further, the dummy gate electrode layer 308 may be doped poly-silicon with the same or different doping. The dummy gate electrode layer 308 comprises any suitable thickness. In at least one embodiment, the dummy gate electrode layer 308 comprises a thickness in the range of about 30 nm to about 60 nm. In some embodiments, the dummy electrode layer 308 is preferably formed using a low-pressure chemical vapor deposition (LPCVD) process. The LPCVD process can be carried out in a standard LPCVD furnace at a temperature of about 580° C. to 650° C., and at a pressure of about 200 mTorr to 1 Torr, using silane ($SiH_4$), disilane ($Si_2H_6$), trisilane ($Si_3H_8$) or dichlorosilane ($SiH_2Cl_2$) as silicon source gas.

Then, a layer of photoresist is formed over the dummy gate structure 301 by a suitable process, such as spin-on coating, and patterned to form a patterned photoresist feature by a proper lithography patterning method. In some embodiments, a width of the patterned photoresist feature is in the range of about 15 to 45 nm. The patterned photoresist feature can then be transferred using a dry etching process to the underlying layers (i.e., the dummy oxide layer 306 and the dummy gate electrode layer 308) to form the dummy gate structure 301. The photoresist layer may be stripped thereafter. In another example, a hard mask layer is formed over the dummy gate structure 301; a patterned photoresist layer is formed on the hard mask layer; the pattern of the photoresist layer is transferred to the hard mask layer and then transferred to the dummy gate electrode layer 308 and the dummy oxide layer 306 to form the dummy gate structure 301. It is understood that the above examples do not limit the processing steps that may be utilized to form the dummy gate structure 301. It is further understood that, in some embodiments, the dummy gate structure 301 may comprise additional dielectric layers and/or conductive layers. For example, the dummy gate structure 301 may comprise hard mask layers, interfacial layers, capping layers, diffusion/barrier layers, other suitable layers, and/or combinations thereof.

Figure 3B:
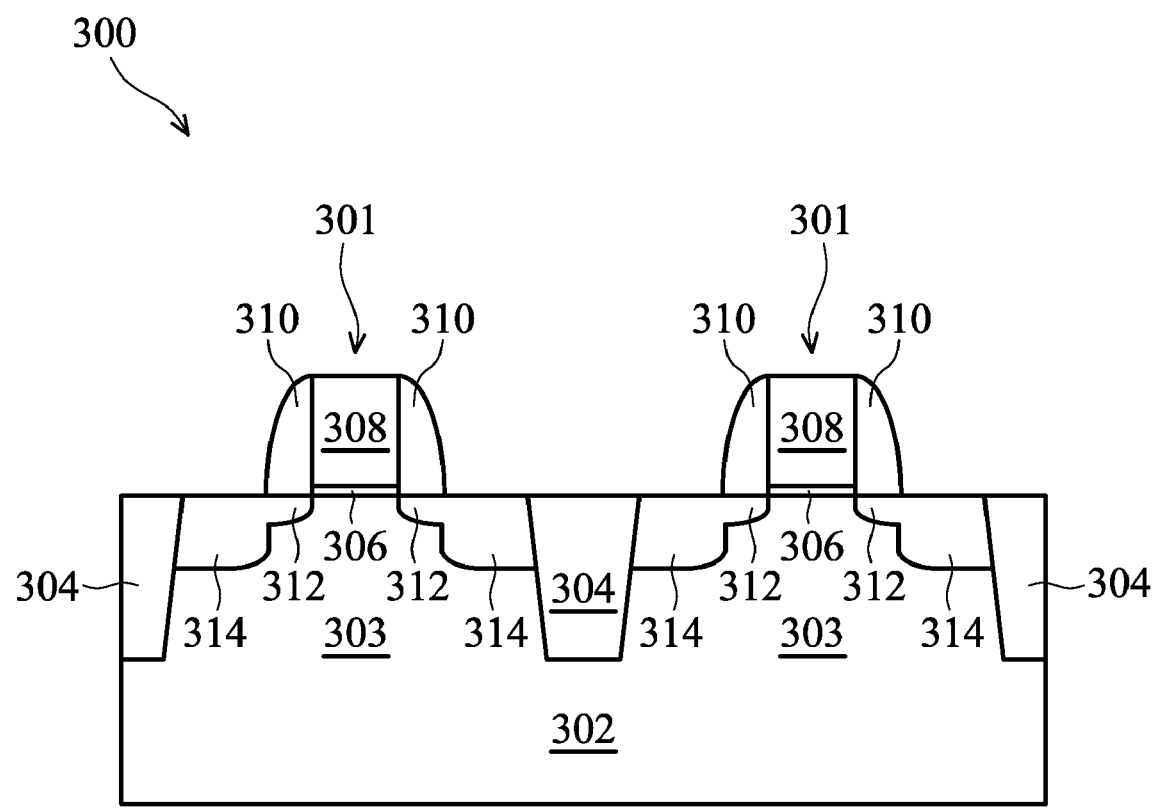

Referring to FIG. 3B, lightly doped source/drain (LDD) regions 312 may be formed in the active regions 303 of the substrate 302. The LDD regions 312 may be formed in the active regions 303 by one or more implantation processes, such as an ion implantation process. The doping species may depend on the type of device being fabricated, such as an NMOS or PMOS device. For example, the LDD regions 312 may doped with p-type dopants, such as boron or $BF_2$; n-type dopants, such as phosphorus or arsenic; and/or combinations thereof. The LDD regions 312 may comprise various doping profiles. In some embodiments, the LDD regions 312 may be aligned with an outer edge of the dummy gate structure 301 following the ion implantation process.

Referring to FIGS. 2 and 3B through 3D, the method 200 continues with step 206 in which a nitrogen-containing dielectric layer 310 and an interlayer dielectric (ILD) layer 318 are formed to surround the dummy oxide layer 306 and the dummy gate electrode layer 308. The nitrogen-containing dielectric layer 310 acts as gate spacers, and hence may be referred to as gate spacers 310. The gate spacers 310 may be on each side of the dummy gate structure 301. In some embodiments, the gate spacers 310 are preferably formed by plasma deposition at a temperature less than 400° C. and at a pressure of about 200 mTorr to 1 Torr, using $SiH_4$, $NH_3$ and/or $N_2O$ as reaction gases. The gate spacers 310 may comprise the nitrogen-containing dielectric layer 310 such as silicon nitride, silicon oxynitride, and/or combinations thereof. In some embodiments, the gate spacers 310 may comprise a multilayer structure. The gate spacers 310 comprise any suitable thickness. In at least one embodiment, the gate spacers 310 comprise a thickness in the range of about 7 nm to about 15 nm.

Still referring to FIG. 3B, the gate spacers 310 may be used to offset source/drain (S/D) regions 314 (also referred to as heavily doped source/drain regions). The S/D regions 314 may be formed in the active regions 303 of the substrate 302 by one or more implantation processes, such as an ion implantation process. The doping species may depend on the type of device being fabricated, such as an NMOS or PMOS device. For example, the S/D regions 314 may doped with p-type dopants, such as boron or $BF_2$; n-type dopants, such as phosphorus or arsenic; and/or combinations thereof. The S/D regions 314 may comprise various doping profiles, and the S/D regions 314 may be aligned with an outer edge of the spacers 310 following the ion implantation process. The S/D regions 314 may further include raised S/D regions in some embodiments. Also, one or more contact features (e.g., silicide regions) may be formed on the S/D regions 314 by, for example, a self-aligned silicidation process.

Figure 3C:
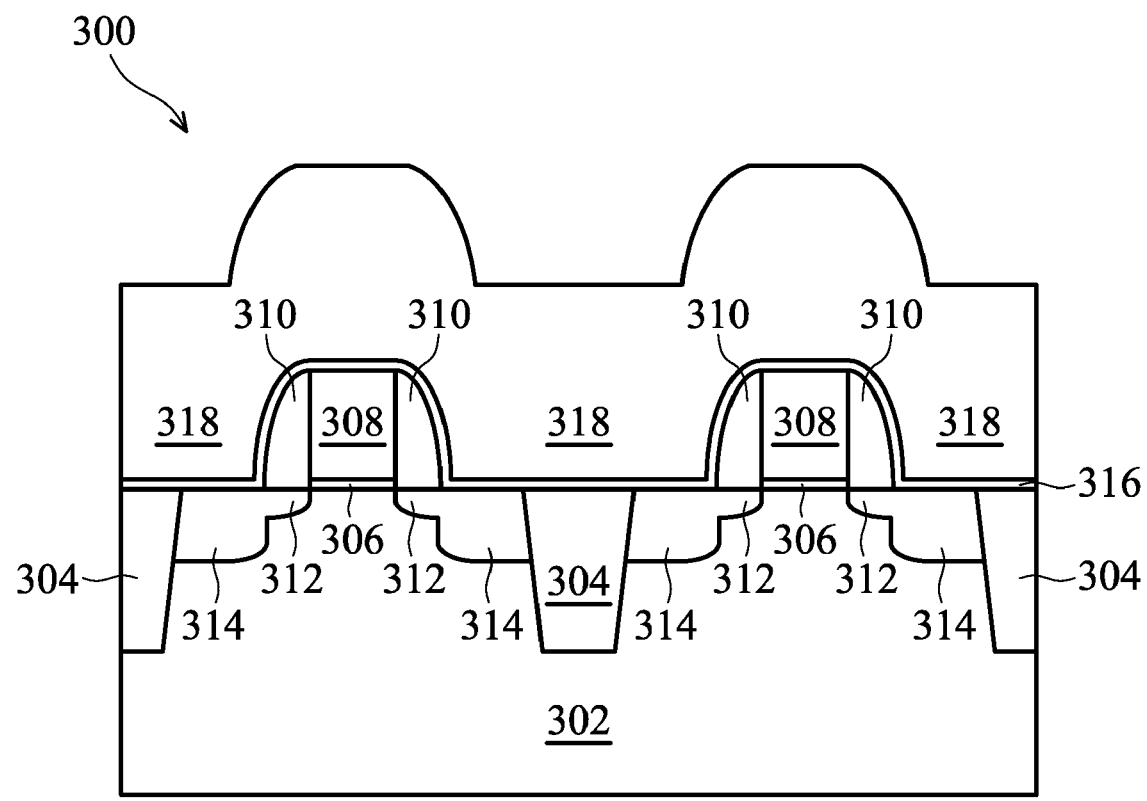

Referring to FIG. 3C, an optional contact etch stop layer (CESL) 316 may be formed over the substrate 302, including over the dummy gate structure 301, by any suitable process, including the processes described herein. In some embodiments, the CESL 316 may be formed of silicon oxide, silicon nitride, silicon oxynitride, or combinations thereof, but is more preferably formed of silicon nitride (e.g., SiN) by a plasma enhanced CVD (PECVD) mixed frequency process. For example, in some embodiments, a dual RF power source having a range of frequency from about 50 KHz to about 13.56 MHz is preferably used for the PECVD process. For example, the mixed frequency method includes supplying a precursor such as silane ($SiH_4$) and/or hexachlorodisilane (HCD) ($Si_2Cl_6$) and $NH_3$ at a deposition temperature of from about 300° C. to about 600° C., at a pressure of from about 50 mTorr to about 5 Torr, with high frequency RF powers of from about 70 Watts to about 300 Watts, and with low frequency RF powers of from about 5 Watts to 60 Watts. The CESL 316 further comprises any suitable thickness. In at least one embodiment, the CESL 316 comprises a thickness of about 200 Å. In some embodiments, the CESL 316 is not used.

Still referring to FIG. 3C, following formation of the CESL 316, the ILD layer 318 may be formed over the CESL 316. The ILD layer 318 may comprise a dielectric material. In some embodiments, the dielectric material may comprise silicon oxide, spin-on glass (SOG), fluorinated silica glass (FSG), carbon doped silicon oxide (e.g., SiCOH), Black Diamond® (Applied Materials of Santa Clara, Calif.), other suitable dielectric materials, and/or combinations thereof. In some embodiments, the ILD layer 318 may include a high density plasma (HDP) dielectric material (e.g., HDP oxide) and/or a high aspect ratio process (HARP) dielectric material (e.g., HARP oxide). The ILD layer 318 comprises any suitable thickness. In at least one embodiment, ILD layer 318 comprises a thickness in the range of about 4000 Å to about 8000 Å. It is understood that the ILD layer 318 may comprise one or more dielectric materials and/or one or more dielectric layers.

Figure 3D:
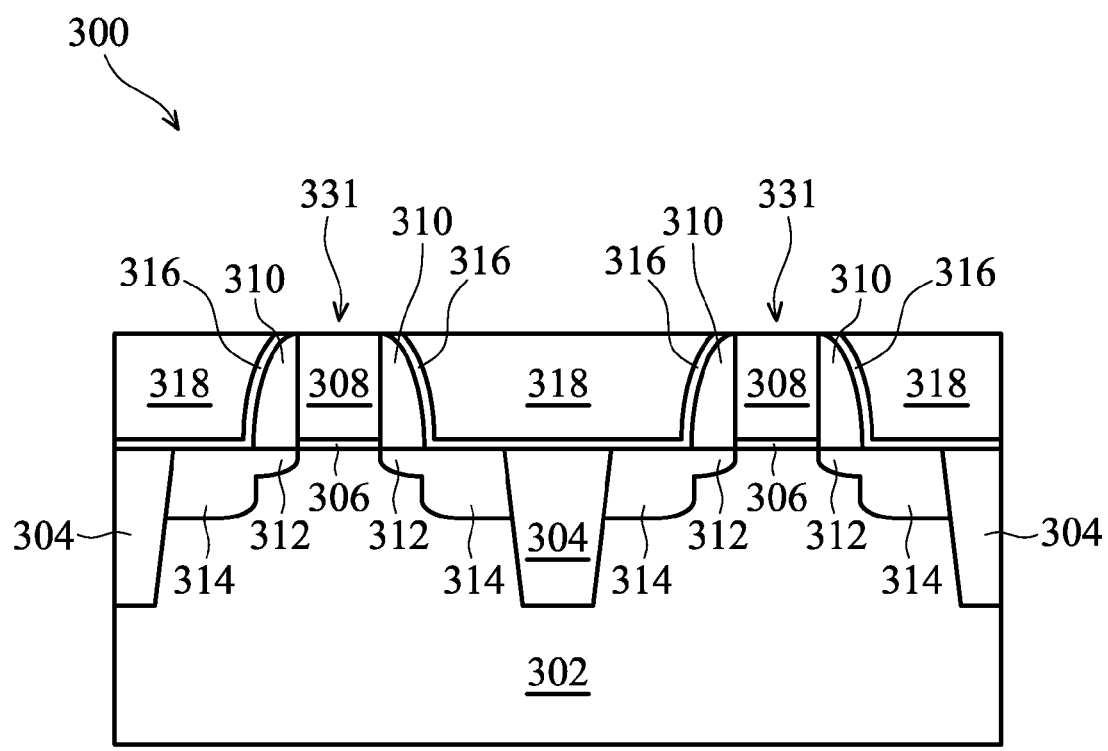

Subsequently, the CESL 316 and/or ILD layer 318 may be planarized by a chemical-mechanical-polishing (CMP) process until a top portion of the dummy gate structure 301 overlying the substrate 302 is exposed as illustrated in FIG. 3D. The CMP process may have a high selectivity to provide a substantially planar surface for the dummy gate structure 301, gate spacers 310, CESL 316, and ILD layer 318. In at least one embodiment, the dummy oxide layer 306 and the dummy gate electrode layer 308 may be surrounded with dielectric comprising the gate spacers 310 (the nitrogen-containing dielectric layer 310), CESL 316, and ILD layer 318.

Figure 3E:
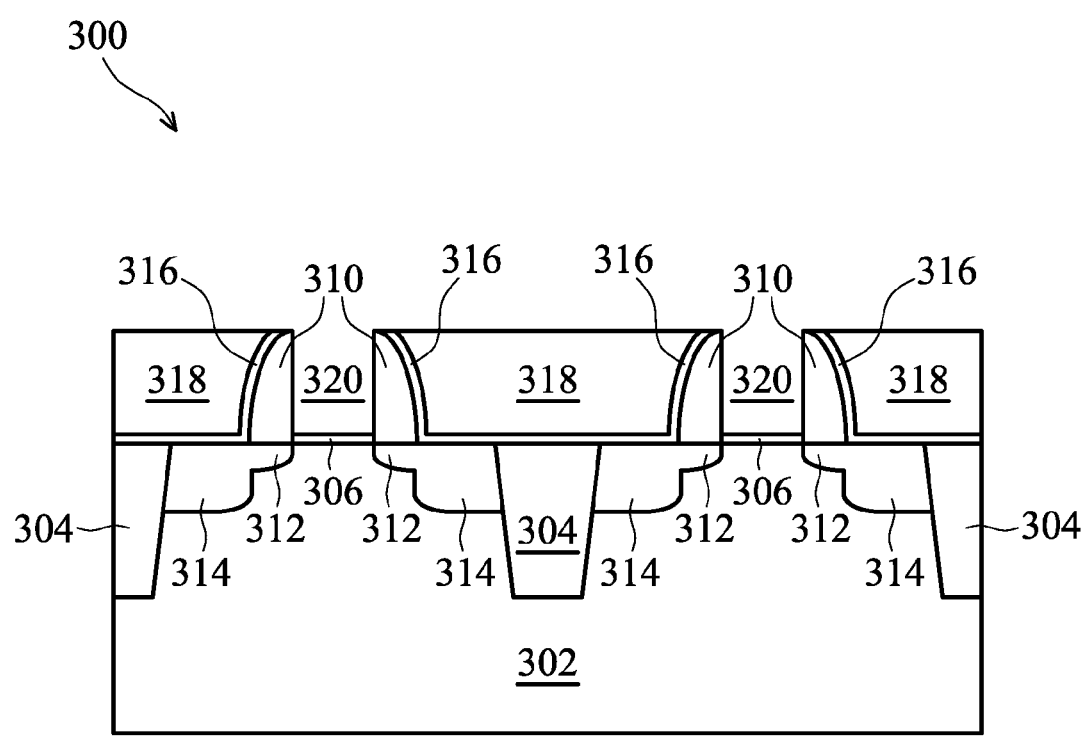

Referring to FIGS. 2 and 3E, the method 200 continues with step 208 in which the dummy gate electrode layer 308 may be removed from the dummy gate structure 301 surrounded with the nitrogen-containing dielectric layer 310 and ILD layer 318. The dummy gate electrode layer 308 may be removed to form an opening 320 in the nitrogen-containing dielectric layer 310 by any suitable process, including the processes described herein. The dummy gate electrode layer 308 may be removed using a wet etch and/or a dry etch process. In one embodiment, the wet etch process for dummy poly-silicon gate electrode layer 308 includes exposure to a hydroxide solution containing ammonium hydroxide, diluted HF, deionized water, and/or other suitable etchant solutions. In another embodiment, the dry etch process for dummy poly-silicon gate electrode layer 308 may be performed under a source power of about 650 to 800 W, a bias power of about 100 to 120 W, and a pressure of about 60 to 200 mTorr, using Cl2, HBr and He as etching gases.

Figure 3F:
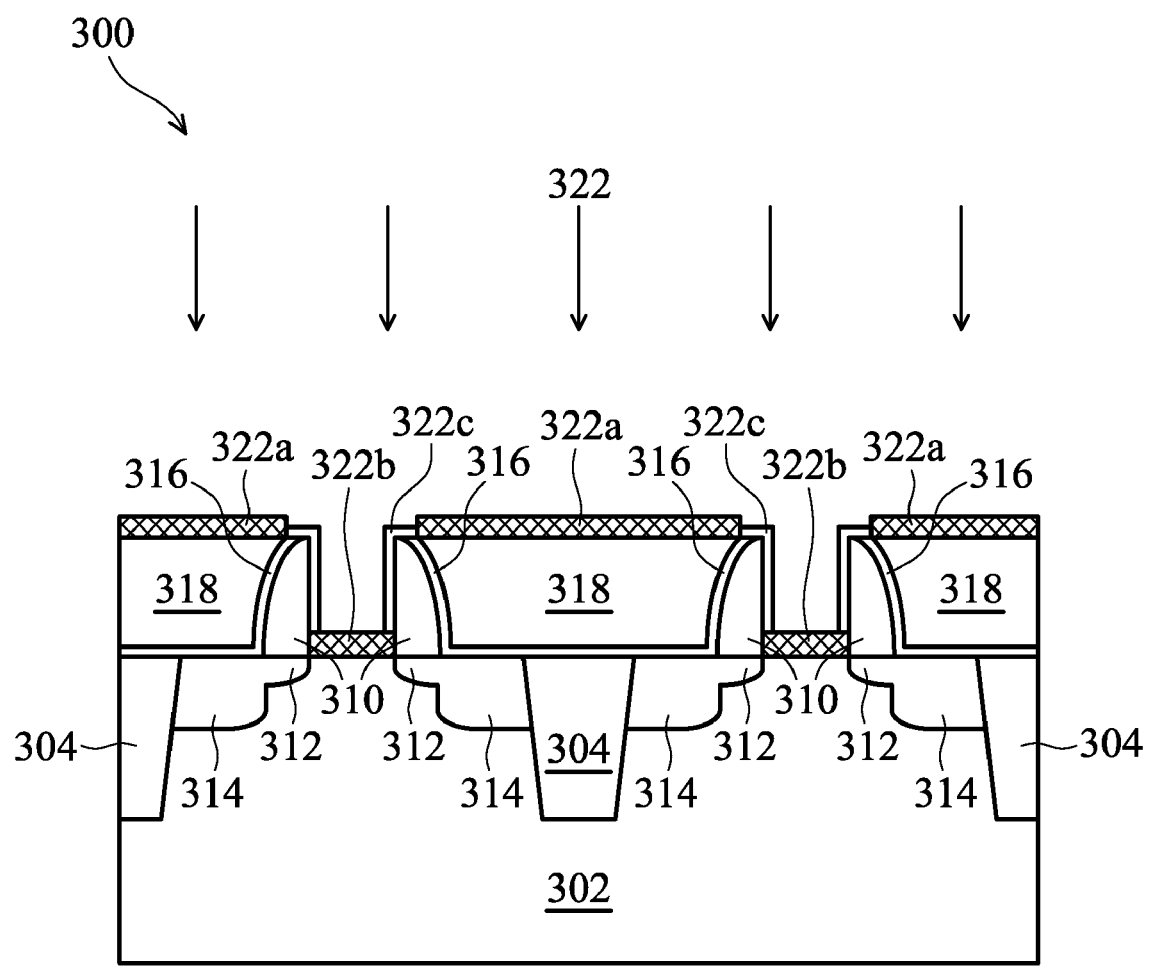
Figure 3G:
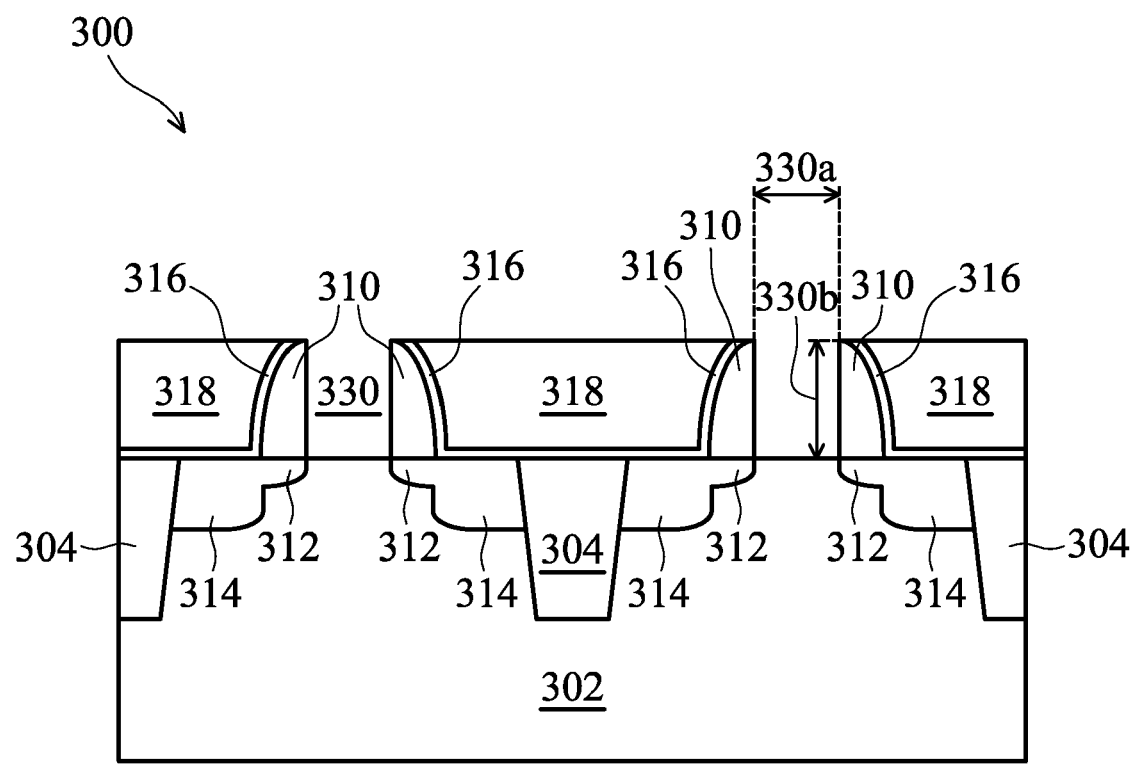

Referring to FIGS. 2 and 3F, the method 200 continues with step 210 in which the dummy oxide layer 306 is removed. In some embodiments, the dummy oxide layer 306 is removed by a vapor phase etching process. The vapor phase etching process starts with introducing the structure of FIG. 3E into a sealed reaction chamber in which the vapor phase etching process uses gas phase reactants. The etching process is self-limiting, in that amount of material removed is determined by amount of the gas phase reactants introduced into the reaction chamber. In some embodiments, the vapor phase etching process comprises a vapor mixture 322 comprising $NH_3$ and a fluorine-containing compound. It is believed that one of the vapor phase components functions as a catalyst and the other component functions an etchant. In some embodiments, the fluorine-containing compound may be a compound selected from the group of HF or $NF_3$.

In one embodiment, the vapor mixture 322 comprises $NH_3$ and HF. The vapor mixture of $NH_3$ and HF comprises a ratio of $NH_3$ to HF between about 0.1 to 10, and preferably a ratio of 1 part $NH_3$ to 1 part HF by volume. In another embodiment, the vapor mixture 322 comprises $NH_3$ and $NF_3$. The vapor mixture of $NH_3$ and $NF_3$ comprises a ratio of $NH_3$ to $NF_3$ between about 0.5 to 5, preferably a ratio of 2 parts $NH_3$ to 1 part $NF_3$ by volume.

While the mechanism of the reaction does not affect the scope of the claims, it is believed that, in some embodiments, the vapor phase etching process is a multiple step process. For a first step, a blanket adsorbed reactant film of the vapor mixture 322 of $NH_3$ and fluorine-containing compound may be formed over the top surface of the dummy oxide layer 306 and the surface of the dielectric comprising the gate spacers 310 (the nitrogen-containing dielectric layer 310), CESL 316, and ILD layer 318 in the reaction chamber. In one embodiment, the first step using the vapor mixture 322 of $NH_3$ and HF is performed at a pressure between 10 mTorr and 25 mTorr and at a first temperature between 20° C. and 70° C. In another embodiment, the first step using the vapor mixture 322 of $NH_3$ and $NF_3$ is performed at a pressure between 2 Torr and 4 Torr and at a first temperature between 20° C. and 70° C.

For a second step, the adsorbed reactant film may react with the top surface of the dummy oxide layer 306 in contact therewith to form a first condensed and solid reaction product 322b beneath the adsorbed reactant film. The adsorbed reactant film may also react with the top surface of the ILD layer 318 in contact therewith to form a second condensed and solid reaction product 322a beneath the adsorbed reactant film. The adsorbed reactant film 322c may not or less react with the surface of the gate spacers 310 (the nitrogen-containing dielectric layer 310) and CESL 316 in contact therewith beneath the adsorbed reactant film.

Next, the reaction chamber may be heated to a second temperature between 90° C. to 200° C. while sublimation products of the solid reaction products 322a, 322b and the adsorbed reactant film 322c may be pumped out from the reaction chamber. In some alternative embodiments, the reaction chamber may be heated to a temperature between 90° C. to 200° C. while flowing a carrier gas over the substrate 302 to remove sublimation products of the solid reaction products 322a, 322b and the adsorbed reactant film 322c from the reaction chamber. In some embodiments, the carrier gas can be any inert gas. Preferably, the carrier gas comprises N2, He, or Ar. In some embodiments, the substrate 302 is transferred into a heated chamber that is heated to a temperature between 90° C. to 200° C. while sublimation products of the solid reaction products 322a, 322b and the adsorbed reactant film 322c may be pumped out from the heated chamber. In some alternative embodiments, the substrate 302 is transferred into a heated chamber that is heated to a temperature between 90° C. to 200° C. while flowing a carrier gas over the substrate 20 to remove sublimation products of the solid reaction product 322a, 322b and the adsorbed reactant film 322c from the heated chamber. In some embodiments, the carrier gas can be any inert gas. Preferably, the inert gas includes N2, He, and Ar.

This reaction proceeds until solid reaction products 322a, 322b and the adsorbed reactant film 322c are removed. The vapor mixture preferentially etches the dummy oxide layer 306 so that little or none of the gate spacers 310 and CESL 316 are removed. Accordingly, at the end of the vapor phase etching process shown in FIG. 3G, the vapor phase etching process may fully remove the dummy oxide layer 306 and partially remove the ILD layer 318, exposing the silicon substrate 302, and forming an opening 330 in the nitrogen-containing dielectric layer 310. In one embodiment, a width 330a of the opening 330 may be in the range of about 15 to 45 nm. In another embodiment, a height 330b of the opening 330 may be in the range of about 30 to 60 nm. In still another embodiment, a ratio of the height 330b to the width 330a is from 1.5 to 4.

Since the vapor phase etching process has almost no selectivity for the dummy oxide layer 306 and the ILD layer 318, in some embodiments, the ILD layer may lose almost the same thickness as the dummy oxide layer 306 does, less than 1% of thickness of the ILD layer 318. Therefore, the method for fabricating a gate structure creates almost no recess in the ILD layer 318.

On the other hand, it is preferable not to etch through the gate spacers 310 by the vapor phase etching process. The attacked gate spacers 310 may not serve as a stop layer in subsequent processes thereby increasing the likelihood of damage of ILD layer 318. In one embodiment, a ratio of removal rates by the vapor mixture 322 of the dummy oxide layer 306 and the gate spacer 310 is greater than 2. Furthermore, the silicon substrate 302 is not attacked by the vapor phase etching process. The attacked silicon substrate 302 will act as a source of crystal defects in subsequent processes thereby increasing the likelihood of electrical leakage. In one embodiment, a ratio of removal rates by the vapor mixture 322 of the dummy oxide layer 306 and the silicon substrate 302 is greater than 100. Therefore, the method for fabricating a gate structure has almost no recess in the substrate 302.

Figure 3H:
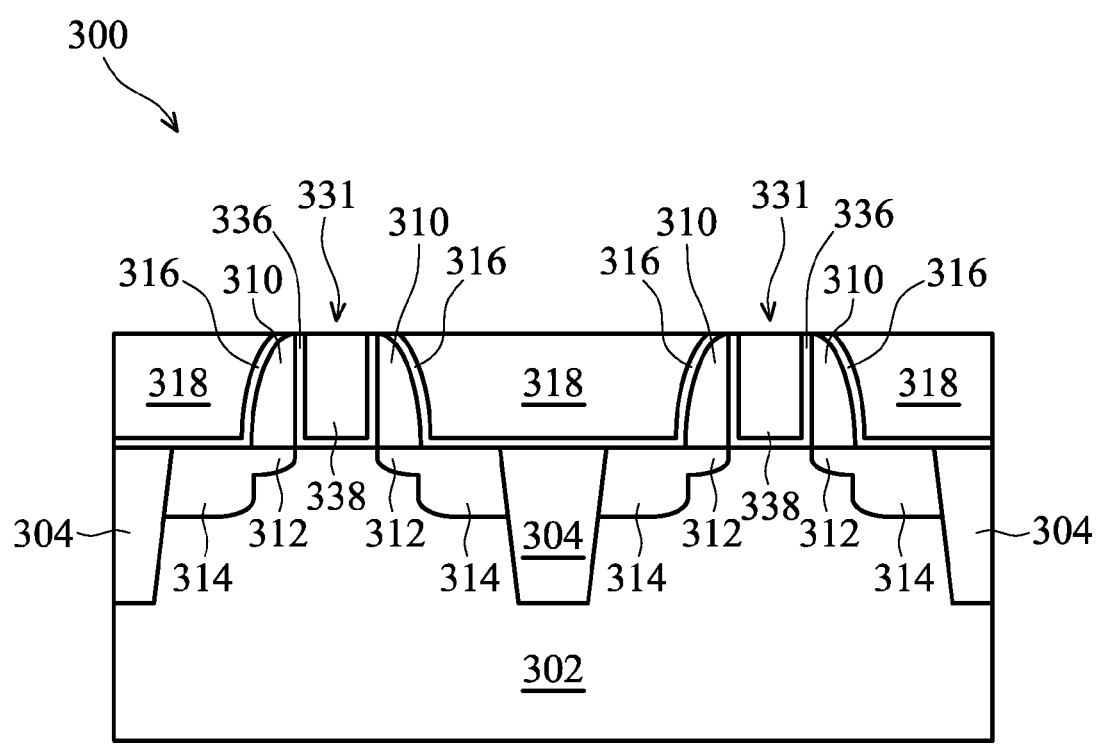

Referring to FIGS. 2 and 3H, the method 200 continues with step 212 in which a gate dielectric 336 and a gate electrode 338 may be deposited to completely fill the opening 330 to form a gate structure 331. In some embodiments, the gate dielectric layer 336 may comprise silicon oxide, silicon oxynitride, high-k dielectric layer or combination thereof. The high-k dielectric layer may comprise hafnium oxide ($HfO_2$), hafnium silicon oxide (HfSiO), hafnium silicon oxynitride (HfSiON), hafnium tantalum oxide (FRTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the high-k gate dielectric has a thickness less than 2 nm in the opening 330. The gate dielectric layer 336 may further comprise an interfacial layer to reduce damages between the gate dielectric layer 336 and the substrate 302. The interfacial layer may comprise silicon oxide. In some embodiments, the gate electrode 338 comprises a material selected from a group of Al, Cu, AiTi, TiN, TiCN, TaN, TaCN, WN and WCN. In some embodiments, the metal gate electrode has a gate length less than 32 nm in the opening 330. After filling the opening 330 with the gate dielectric 336 and the gate electrode 338, a CMP process may be performed to planarize the gate dielectric 336 and a gate electrode 338. The CMP process may remove a portion of the gate dielectric 336 and a gate electrode 338 until the top surface of the ILD layer 318 is reached. Then, subsequent processes, including interconnect processing, are performed after forming the metal gate electrode 338 of the gate structure 331 to complete the semiconductor device 300 fabrication.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The invention can be used to form or fabricate a gate structure for Field-Effect Transistors. In this way, a gate structure being etched by dry chemical has almost no recess in the interlayer dielectric layer or the substrate.

What is claimed is:

1. A method for fabricating a gate structure, comprising:
   sequentially depositing and patterning a dummy oxide layer and a dummy gate electrode layer on a substrate;
   surrounding the dummy oxide layer and the dummy gate electrode layer with a nitrogen-containing dielectric layer and an interlayer dielectric layer;
   removing the dummy gate electrode layer;
   removing the dummy oxide layer by exposing a surface of the dummy oxide layer to a vapor mixture comprising NH3 and a fluorine-containing compound at a first temperature;
   heating the substrate to a second temperature higher than the first temperature to form an opening in the nitrogen-containing dielectric layer;
   depositing a gate dielectric; and
   depositing a gate electrode.

2. The method of claim 1, wherein the first temperature is between 20° C. and 70° C., and the second temperature is between 90° C. to 200° C.

3. The method of claim 1, wherein a width of the opening is in the range of about 15 to 45 nm.

4. The method of claim 1, wherein a height of the opening is in the range of about 30 to 60 nm.

5. The method of claim 1, wherein a ratio of a height to a width of the opening is from 1.5 to 4.

6. The method of claim 1, wherein the step of depositing a gate dielectric comprises forming a high-k gate dielectric with a thickness less than 2 nm in the opening.

7. The method of claim 1, wherein the step of depositing a gate electrode comprises forming a metal gate electrode with a gate length less than 32 nm in the opening.

8. The method of claim 1, wherein the nitrogen-containing dielectric layer comprises silicon nitride or silicon oxy-nitride.

9. The method of claim 1, wherein a ratio of removal rates by the vapor mixture of the dummy oxide layer and the nitrogen-containing dielectric layer is greater than 2.

10. The method of claim 1, wherein a ratio of removal rates by the vapor mixture of the dummy oxide layer and the silicon substrate is greater than 100.

11. The method of claim 1, wherein the fluorine-containing compound is a compound selected from the group of HF or NF3.

12. The method of claim 11, wherein the vapor mixture comprises NH3 and HF.

13. The method of claim 12, wherein the vapor mixture of NH3 and HF comprises a ratio of 1 part NH3 to 1 part HF by volume.

14. The method of claim 12, wherein the step of exposing a surface of the dummy oxide layer and a surface of the nitrogen-containing insulator to a vapor mixture is performed at a pressure between 10 mTorr and 25 mTorr.

15. The method of claim 1, wherein the vapor mixture comprises NH3 and NF3.

16. The method of claim 15, wherein the vapor mixture of NF3 and NH3 comprises a ratio of 2 parts NH3 to 1 part NF3 by volume.

17. The method of claim 15, wherein the step of exposing a surface of the dummy oxide layer and a surface of the nitrogen-containing insulator to a vapor mixture is performed at a pressure between 2 Torr and 4 Torr.

18. The method of claim 1, wherein the step of removing the dummy oxide comprises flowing a carrier gas over the substrate.

19. The method of claim 18, wherein the carrier gas comprises an inert gas.

20. The method of claim 19, wherein the inert gas comprises N2, He, or Ar.

21. The method of claim 19 further comprises forming a contact etch stop layer between the nitrogen-containing dielectric layer and the interlayer dielectric layer.

* * * * *